(12) United States Patent
Min et al.

(10) Patent No.: US 10,212,803 B2
(45) Date of Patent: Feb. 19, 2019

(54) CIRCUIT BOARD AND CIRCUIT BOARD ASSEMBLY

(71) Applicant: SAMSUNG ELECTRO-MECHANICS CO., LTD., Suwon-si (KR)

(72) Inventors: Tae Hong Min, Hwaseong-si (KR); Myung Sam Kang, Hwaseong-si (KR); Jung Han Lee, Seoul (KR); Young Gwan Ko, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 95 days.

(21) Appl. No.: 15/198,110

(22) Filed: Jun. 30, 2016

(65) Prior Publication Data

US 2016/0309575 A1    Oct. 20, 2016

Related U.S. Application Data

(63) Continuation of application No. PCT/KR2015/006302, filed on Jun. 22, 2015.

(30) Foreign Application Priority Data

Jun. 23, 2014 (KR) .................. 10-2014-0076796
Jul. 29, 2014 (KR) .................. 10-2014-0096779
Dec. 30, 2014 (KR) .................. 10-2014-0193384

(51) Int. Cl.
*H05K 1/02* (2006.01)
*H05K 1/11* (2006.01)
(Continued)

(52) U.S. Cl.
CPC ......... *H05K 1/0206* (2013.01); *H05K 1/0204* (2013.01); *H05K 1/0209* (2013.01);
(Continued)

(58) Field of Classification Search
CPC .......... H05K 2201/10416; H05K 2201/09036; H05K 1/141; H05K 1/0206; H05K 1/0204; H01L 23/49833
See application file for complete search history.

(56) References Cited

U.S. PATENT DOCUMENTS 6,156,980 A * 12/2000 Peugh ................. H01L 23/3677
174/252
2004/0000425 A1 * 1/2004 White ................... H01F 41/041
174/250

(Continued)

FOREIGN PATENT DOCUMENTS

JP    2011-9715 A    1/2011
JP    2012-119607 A    6/2012
(Continued)

OTHER PUBLICATIONS

English Translation JP 2012-119607.*
(Continued)

*Primary Examiner* — Steven T Sawyer
(74) *Attorney, Agent, or Firm* — NSIP Law

(57) ABSTRACT

A circuit board includes an insulating part including insulating layers, metal layers disposed on the insulating layers, vias each passing through at least one insulating layer among the insulating layers and connecting together at least two metal layers among the metal layers; a first thermally conductive structure including a thermally conductive material, at least a part of the thermally conductive structure being inserted into the insulating part, a first via having one surface contacting the first thermally conductive structure, a first metal pattern contacting another surface of the first via, a first bonding member connected to the first metal pattern, and pads to which a first electronic component is connected on an outermost surface of a metal layer disposed on an outermost surface of the insulating part, the pads being at least in a first region and a second region having a higher temperature than the first region.

23 Claims, 11 Drawing Sheets

(51) Int. Cl.
*H05K 1/18* (2006.01)
*H05K 3/46* (2006.01)

(52) U.S. Cl.
CPC ........... *H05K 1/0298* (2013.01); *H05K 1/111* (2013.01); *H05K 1/181* (2013.01); *H05K 3/4602* (2013.01); *H01L 2224/04105* (2013.01); *H01L 2224/12105* (2013.01); *H01L 2224/2518* (2013.01); *H01L 2924/15311* (2013.01); *H01L 2924/3511* (2013.01); *H05K 1/0207* (2013.01); *H05K 1/185* (2013.01); *H05K 3/4608* (2013.01); *H05K 2201/0195* (2013.01); *H05K 2201/0323* (2013.01); *H05K 2201/0338* (2013.01); *H05K 2201/1003* (2013.01); *H05K 2201/10015* (2013.01); *H05K 2201/10022* (2013.01); *H05K 2201/10416* (2013.01); *H05K 2201/10674* (2013.01); *H05K 2201/10727* (2013.01)

(56) References Cited

U.S. PATENT DOCUMENTS

| | | | | |
|---|---|---|---|---|
| 2004/0124405 | A1* | 7/2004 | Sethumadhavan | B32B 15/04 257/1 |
| 2008/0149384 | A1* | 6/2008 | Kawabe | H01L 23/49822 174/265 |
| 2010/0200277 | A1* | 8/2010 | Huang | H05K 1/0204 174/252 |
| 2013/0027896 | A1* | 1/2013 | Lee | H05K 1/185 361/761 |
| 2013/0039013 | A1* | 2/2013 | Waegli et al. | H05K 1/0204 361/720 |
| 2014/0061692 | A1* | 3/2014 | Preuschl | H05K 1/0206 257/91 |
| 2014/0144677 | A1* | 5/2014 | Wang | H05K 1/0206 174/252 |

FOREIGN PATENT DOCUMENTS

| | | |
|---|---|---|
| JP | 2013-106421 A | 5/2013 |
| KR | 10-0810242 B1 | 3/2008 |
| KR | 10-2013-0014122 A | 2/2013 |

OTHER PUBLICATIONS

Written Opinion of the International Searching Authority dated Sep. 25, 2015 in counterpart PCT Application No. PCT/KR2015/006302. (22 pages in Korean with English translation).

International Search Report dated Sep. 25, 2015 in counterpart International Application No. PCT/KR2015/006302 (5 pages in Korean with English translation).

* cited by examiner

CIRCUIT BOARD AND CIRCUIT BOARD ASSEMBLY

CROSS REFERENCE TO RELATED APPLICATIONS

This application is a continuation of International Application No. PCT/KR2015/006302 filed on Jun. 22, 2015, which claims the benefit of Korean Patent Application Nos. 10-2014-0076796 filed on Jun. 23, 2014, 10-2014-0096779 filed on Jul. 29, 2014, and 10-2014-0193384 filed on Dec. 30, 2014, in the Korean Intellectual Property Office, the entire disclosures of which are incorporated herein by reference for all purposes.

BACKGROUND

1. Field

This application relates to a circuit board and a circuit board assembly.

2. Description of Related Art

Multilayer board technologies that form wiring layers in circuit boards such as printed circuit boards have been developed in response to demands for electronic devices with lighter weights, smaller sizes, faster speeds, greater capabilities, and higher performances. Furthermore, technologies that mount electronic elements such as active elements and passive elements in multilayer boards have been also developed.

However, application processors with multiple functions and high performance that are mounted on the multilayer boards cause a significant increase in heating of circuits on the multilayer boards.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a circuit board includes an insulating part including insulating layers; metal layers disposed on the insulating layers; vias each passing through at least one insulating layer among the insulating layers and connecting together at least two metal layers among the metal layers; a first thermally conductive structure including a thermally conductive material, at least a part of the first thermally conductive structure being inserted into the insulating part; a first via having one surface contacting the first thermally conductive structure; a first metal pattern contacting another surface of the first via; a first bonding member connected to the first metal pattern; and pads to which a first electronic component is connected on an outermost surface of a metal layer disposed on an outermost surface of the insulating part among the metal layers, the pads including at least one pad in a first region of the circuit board having a first temperature while the first electronic component is operating and at least one pad in a second region of the circuit board having a second temperature higher than the first temperature while the first electronic component is operating.

The first bonding member may be also connected to the first electronic component.

At least a part of the first thermally conductive structure may be positioned below the first electronic component.

The circuit board may further include a second electronic component mounted in the insulating part; and at least a part of the second electronic component may be positioned below the first electronic component.

A distance from the second region to the first bonding member may be less than a distance from the first region to the first bonding member.

The pads may include a first pad through which heat passes while the first electronic component is operating; and a second pad through which a signal passes while the first electronic component is operating; and the first bonding member may be connected to the first pad.

The metal layer disposed on the outermost surface of the insulating part may include a metal pattern connected to the second pad but not connected to the first thermally conductive structure.

The circuit board may further include an adhesion improving part disposed on a surface of the first thermally conductive structure to increase adhesion between the first thermally conductive structure and the insulating part.

The first thermally conductive structure may include a multi-coated layered structure, or at least one side surface of the first thermally conductive structure may have a concave shape.

The circuit board may further include at least one via and at least one metal pattern between the first metal pattern and the first bonding member so that the first bonding member is connected to the first metal pattern through the at least one via and the at least one metal pattern.

An upper surface and a lower surface of the first thermally conductive structure may have a hexahedron shape, and more than one via may contact a same one of the upper surface and the lower surface of the first thermally conductive structure.

The circuit board may further include a second via having one surface contacting a lower surface of the first thermally conductive structure; a second metal pattern contacting another surface of the second via; and a second bonding member connected to the second metal pattern; and an upper surface and the lower surface of the first thermally conductive structure may each have a hexahedron shape, and one surface of the first via may contact the upper surface of the first thermally conductive structure.

The second bonding member may be also connected to an additional board.

A distance from the second region to the first bonding member may be less than a distance from the first region to the first bonding member.

The additional board may include a heat dissipating part including a thermally conductive material and extending through the additional board so that an upper surface and a lower surface of the heat dissipating part are exposed at an upper surface and a lower surface of the additional board; and the second bonding member may include a thermally conductive material, have a cylindrical shape or a polygonal shape, and contact the heat dissipating part.

In another general aspect, a circuit board on which a first electronic component is mounted includes a core part having a first cavity; a first thermally conductive structure h including a thermally conductive material, at least a part of the first thermally conductive structure being inserted into the first cavity; and an insulating layer covering the first thermally conductive structure and the core part; and the core part includes a first core layer including a second thermally conductive structure including a thermally conductive material; a second core layer disposed on one surface of the first core layer; and a third core layer disposed on another surface of the first core layer.

The second thermally conductive structure may further include a first unit structure, the first unit structure including graphite or graphene; and a primer layer disposed on a surface of the graphite or the graphene.

The second thermally conductive structure may further include a second unit structure bonded to an upper surface of the first unit structure, the second unit structure including graphite or graphene; and a primer layer disposed on a surface of the graphite or the graphene.

The second thermally conductive structure may further include a second unit structure bonded to a side surface of the first unit structure, the second unit structure including graphite or graphene; and a primer layer disposed on a surface of the graphite or the graphene.

The second thermally conductive structure may further include graphite or graphene.

The first core layer may have a through hole filled with a same material of which the second core layer and the third core layer are made.

The core part may further have a through via hole passing through the core part; and the circuit board may further include an insulating film disposed on a surface of the core part and an inner surface of the through via hole.

The core part may further have a first core via hole passing through the second core layer and a second core via hole passing through the third core layer to expose a part of the first core layer.

The circuit board may further include a thermally conductive insulating material disposed between the core part and the first thermally conductive structure.

At least a part of the first thermally conductive structure may contact the second thermally conductive structure.

The circuit board may further include a first circuit pattern formed on an upper surface of the core part; and a second circuit pattern formed on a lower surface of the core part; and a thickness of the first thermally conductive structure may be greater than a distance from a lower surface of the second circuit pattern to an upper surface of the first circuit pattern.

The core part may further have a second cavity; at least a part of a second electronic component may be inserted into the second cavity; and at least a part of the first thermally conductive structure and at least a part of the second electronic component may be positioned below the first electronic component.

In another general aspect, a circuit board includes an insulating part; a first thermally conductive structure including a thermally conductive material, at least a part of the first thermally conductive structure being inserted into the insulating part; and an adhesion improving part is disposed on a surface of the first thermally conductive structure to increase adhesion between the first thermally conductive structure and the insulating part.

The adhesion improving part may include silane.

The silane may be acrylic silane.

The insulating part may include a core part including a second thermally conductive structure including a thermally conductive material; and at least one insulating layer disposed on a surface of the core part.

In another general aspect, a circuit board assembly includes an additional board; a circuit board mounted on the additional board; and a first electronic component mounted on the circuit board; and the circuit board includes an insulating part; and a first thermally conductive structure including a thermally conductive material, at least a part of the first thermally conductive material being inserted into the insulating part.

The first electronic component may include a first region that operates at a first temperature while the first electronic component is operating; and a second region that operates at a second temperature higher than the first temperature while the first electronic component is operating; and the first thermally conductive structure may be connected to the second region to transfer heat from the second region to the additional board.

The circuit board may further include a first via having one surface contacting one surface of the first thermally conductive structure; a first metal pattern contacting another surface of the first via; a first bonding member having one surface connected to the first metal pattern, and another surface contacting the electronic component at a position closer to the second region than to the first region; a second via having one surface contacting another surface of the first thermally conductive structure; a second metal pattern contacting another surface of the second via; and a second bonding member having one surface connected to the second metal pattern and another surface contacting the additional board.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
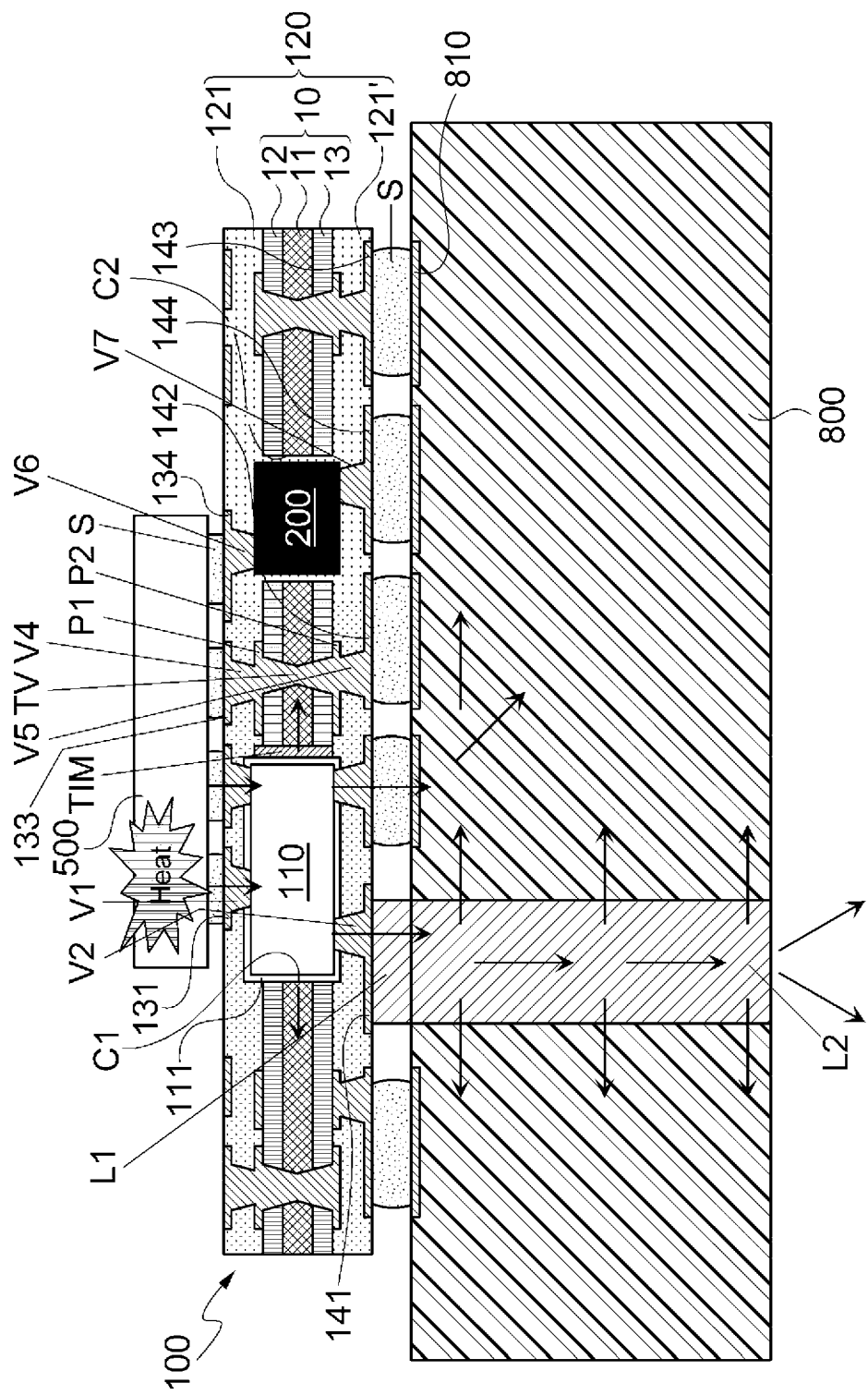
FIG. 1 is a sectional view schematically illustrating an example of a circuit board.
Figure 2:
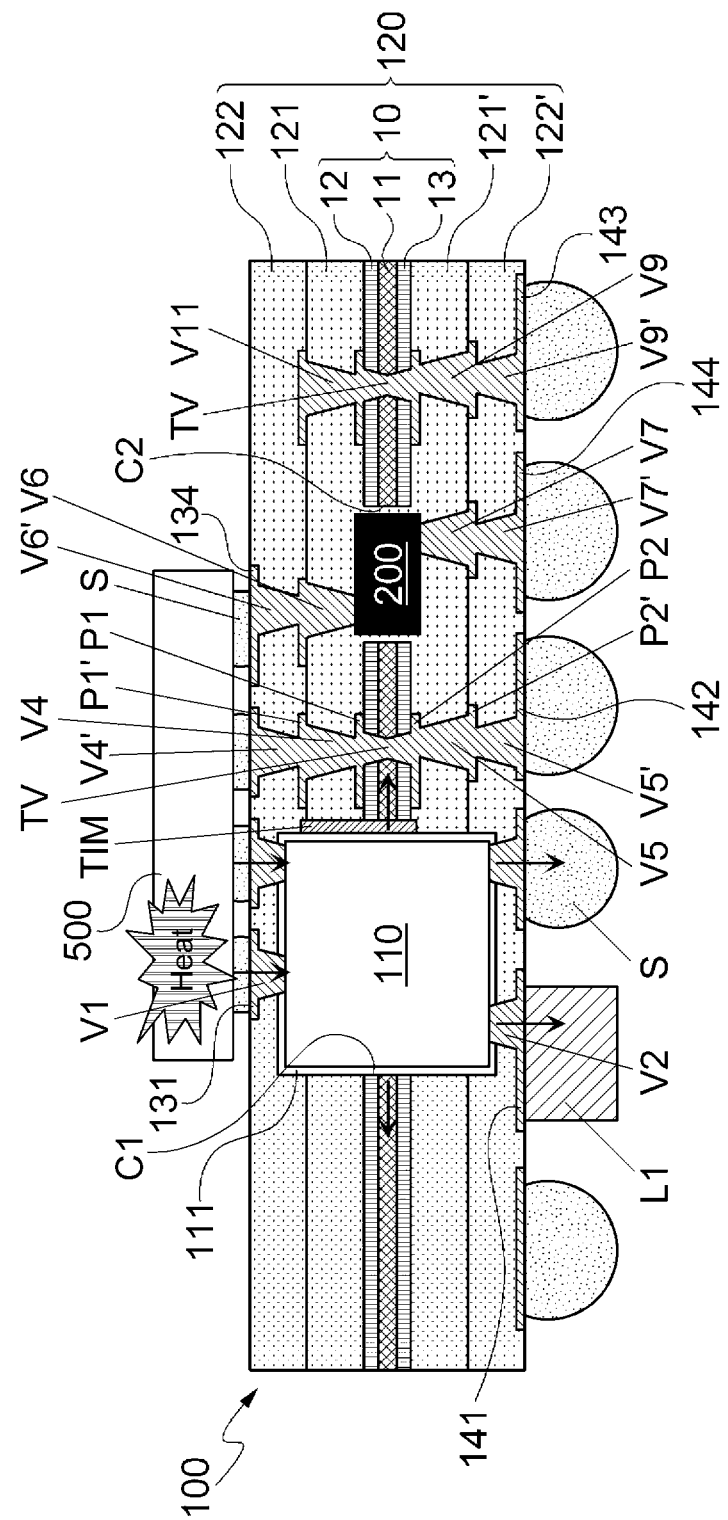
FIG. 2 is a sectional view schematically illustrating another example of a circuit board.
Figure 3:
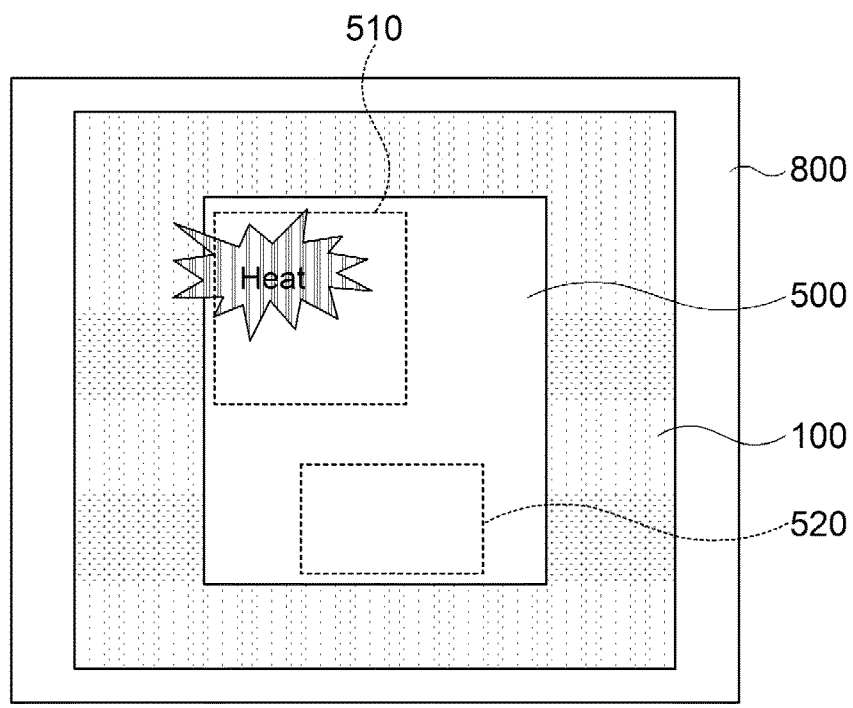
FIG. 3 is a plan view schematically illustrating an example of a circuit board.
Figure 4:
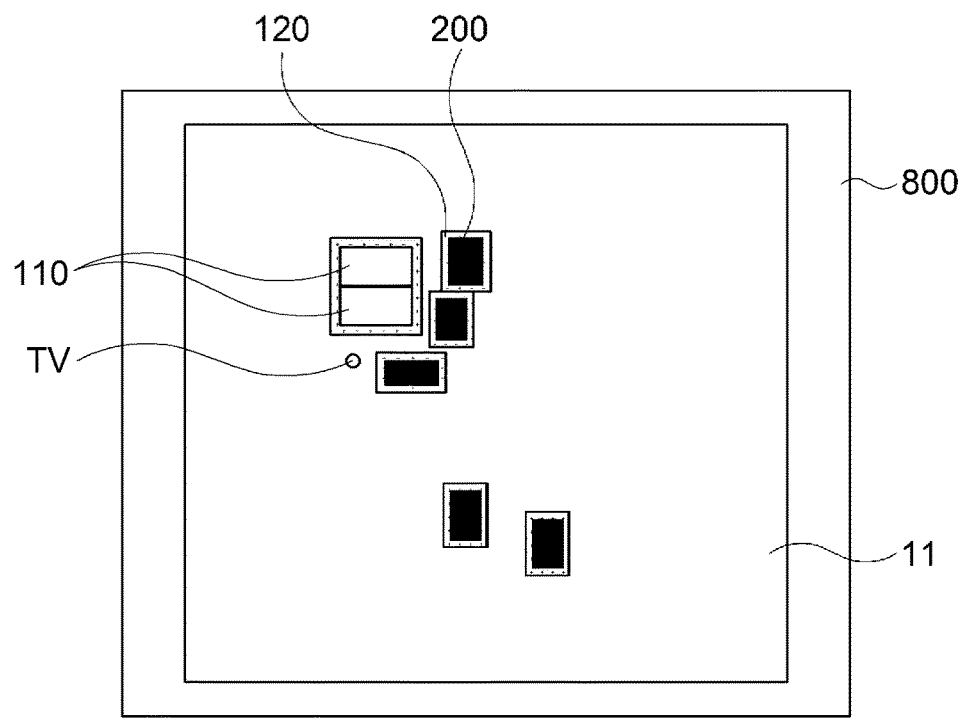
FIG. 4 is a horizontal sectional view schematically illustrating an example of a circuit board including a core part.
Figure 5:
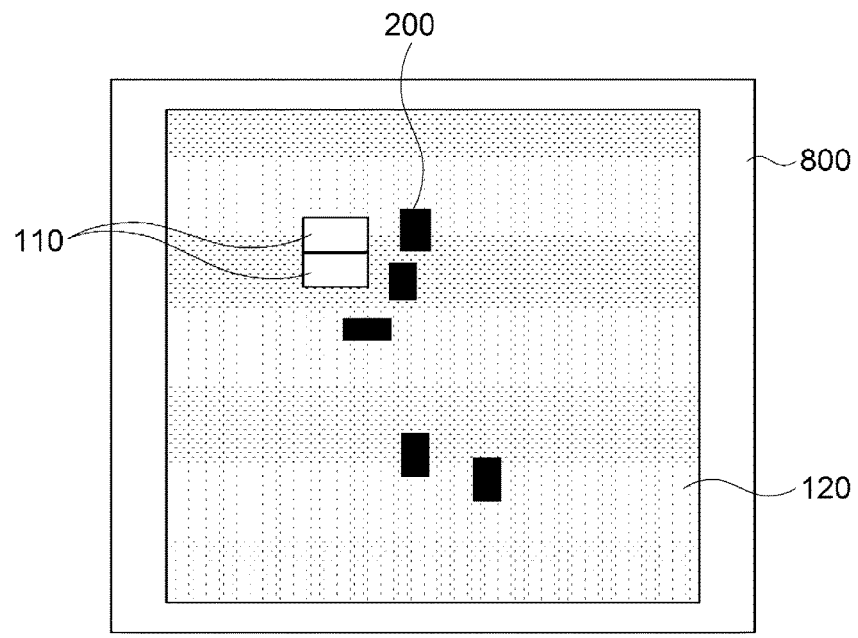
FIG. 5 is a horizontal sectional view schematically illustrating an example of a circuit board without a core part.
Figure 6:
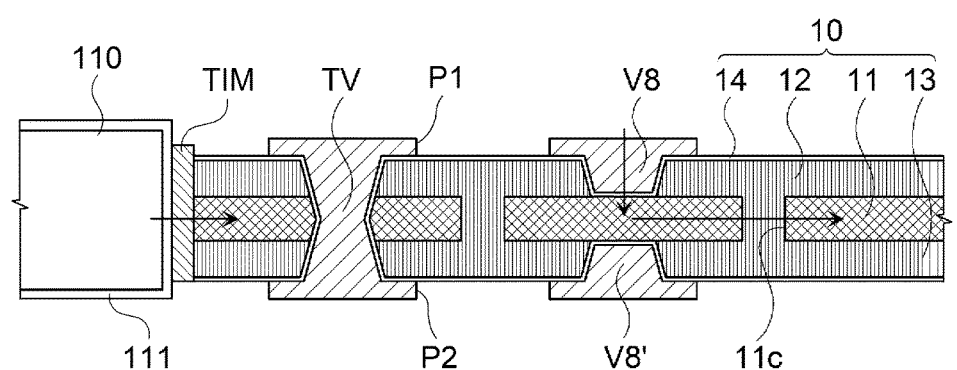
FIG. 6 is a partial sectional view schematically illustrating an example of a portion of a circuit board.
Figure 7:
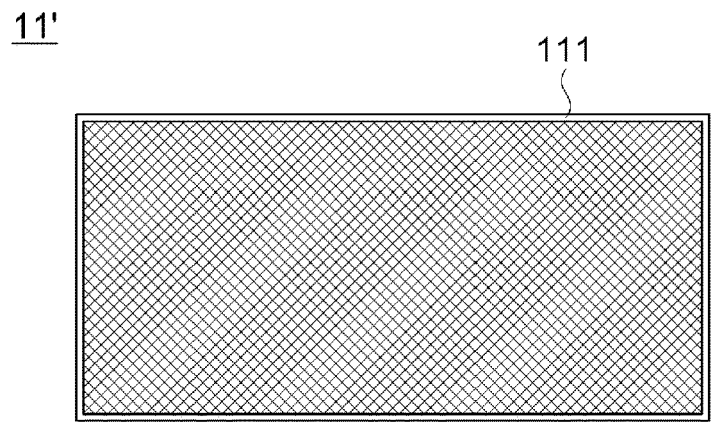
FIG. 7 illustrates an example of a second thermally conductive structure.
Figure 8:
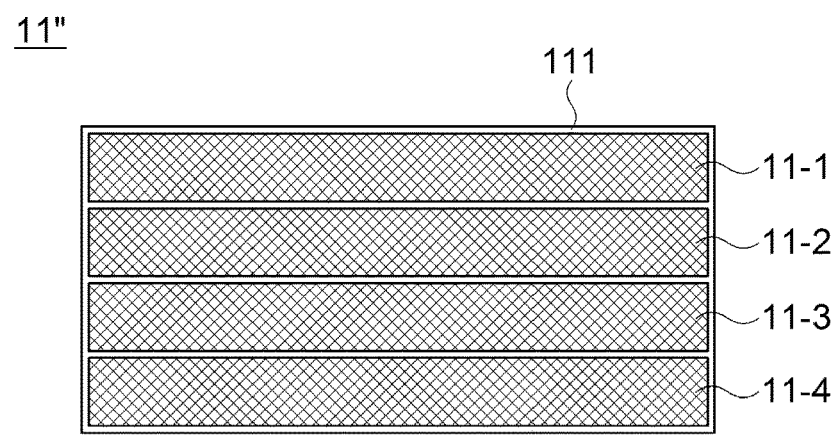
FIG. 8 illustrates another example of a second thermally conductive structure.
Figure 9:
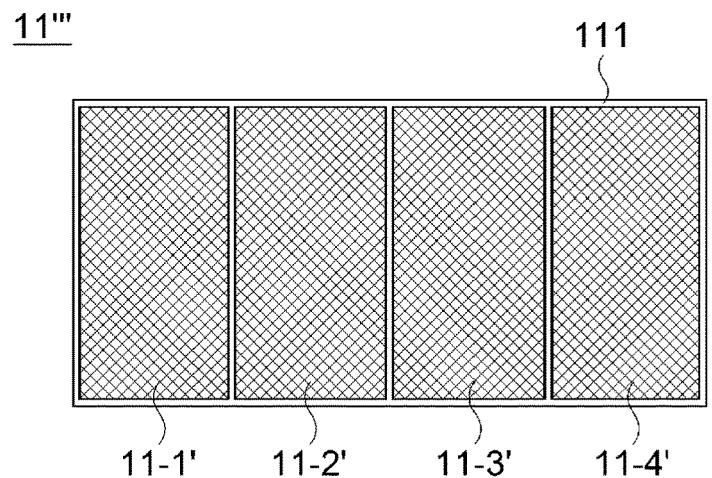
FIG. 9 illustrates another example of a second thermally conductive structure.

FIG. 1 is a sectional view schematically illustrating an example of a circuit board, FIG. 2 is a sectional view schematically illustrating another example of a circuit board 100, FIG. 3 is a plan view schematically illustrating an example of a circuit board 100, FIG. 4 is a horizontal sectional view schematically illustrating an example of a circuit board 100 including a core part, FIG. 5 is a horizontal sectional view schematically illustrating an example of a circuit board 100 without a core part, FIG. 6 is a partial sectional view schematically illustrating an example of a portion of a circuit board 100, FIG. 7 illustrates an example of a second thermally conductive structure, FIG. 8 illustrates another example of a second thermally conductive structure, and FIG. 9 illustrates another example of a second thermally conductive structure.

The circuit board 100 includes a first thermally conductive structure 110 and at least a part of the first thermally conductive structure 110 is inserted into an insulating part 120. The first thermally conductive structure 110 is formed of a material with a high thermal conductivity. The first thermally conductive structure 110 may be formed in a lump shape. In one example, the upper surface and the lower surface of the first thermally conductive structure 110 have a cylindrical shape or a polygonal shape, such as a hexahedron shape. In one example, the first thermally conductive structure 110 is formed of a metallic material such as Cu. In another example, the first thermally conductive structure 110 is formed of a nonmetallic material having a high thermal conductivity such as black lead, graphite, and graphene.

In one example, the insulating part 120 is formed of one insulating layer or of a plurality of insulating layers. In FIG. 1, it is formed of 3 insulating layers 10, 121, and 121'. The insulating layer 10 is a center insulating layer and will be referred to as a core part 10.

In one example, the first thermally conductive structure 110 is located in the middle of the insulating part 120. When the core part 10 is formed as shown in FIG. 1, a cavity C1 that passes through the core part 10 is formed so that the first thermally conductive structure 110 can be inserted into the cavity C1.

In one example, a via formed in the insulating part 120 is in contact with first thermally conductive structure 110. Hereinafter, a via V1 on the upper part of the first thermally conductive structure 110 will be referred to as a first via V1, and a via V2 on the lower part of the first thermally conductive structure 110 will be referred to as a second via V2. At least one metal pattern is formed in the insulating part 120. Hereinafter, a metal pattern 131 that is in contact with the first via V1 will be referred to as a first metal pattern 131, and a metal pattern 141 that is in contact with the second via V2 will be referred to as a second metal pattern 141. A fourth via V4 and a fifth via V5 are formed in the insulating part 120. A metal pattern 133 that is in contact with the fourth via V4 will be referred to as a third metal pattern 133, and a metal pattern 142 that is in contact with the fifth via V5 will be referred to as a fourth metal pattern 142.

The first thermally conductive structure 110 stores heat. The heat storage capacity of the first thermally conductive structure 110 increases as the volume of the first thermally conductive structure 110 increases. In the example in FIG. 1, the first thermally conductive structure 110 is formed in a column shape. The volume of the first thermally conductive structure 110 is maximized when the areas of the upper and lower surfaces of the column are equal. When the upper surface and the lower surface of the first thermally conductive structure 110 are formed in a polygon shape, particularly in a square shape, this may satisfy more current trends of a first electronic component 500 with a smaller size and the circuit board 100 with a smaller size and a finer pattern pitch, compared to when the upper surface and the lower surface of the first thermally conductive structure 110 are formed in a round or oval shape. The volume of the first thermally conductive structure 110 is much larger than the volume of vias such as the first via V1, the second via V2, and the fourth via V4 to a seventh via V7 so that a plurality of vias may be in contact with the upper surface and the lower surface of the first thermally conductive structure 110. That is, areas of the upper surface and the lower surface of the first thermally conductive structure 110 are larger than areas of the vias and the volume of the first thermally conductive structure 110 is at least twice as great as the volume of the vias. Thus, the first thermally conductive structure 110 may absorb heat rapidly from a heat source and disperse it through other paths connected to the first thermally conductive structure 110. A distance between the first thermally conductive structure 110 and a hot spot decreases and thus the transferring time of heat from the hot spot to the first thermally conductive structure 110 is shortened as the thickness of the first thermally conductive structure 110 increases.

In one example, the first electronic component 500 is mounted on one surface of the circuit board 100. The circuit board 100 is mounted on one surface of an additional board 800 such as a main board. The first electronic component 500 is an electronic component such as an application processor (AP), and generates heat during operation.

Heat is generated as the first electronic component 500 operates. There is a region of the first electronic component 500 that operates at a high temperature due to a greater amount heat being generated compared to other regions of the first electronic component 500. This region will be referred to as a hot spot. This hot spot occurs in a certain area in the circuit board 100. In particular, the hop spot occurs at one point or several points of the first electronic component 500. The hot spot may be also formed in a relatively dense region of the first electronic component 500 such as near a power terminal or a switch of the first electronic component 500.

The first electronic component 500 may include both a region with a relatively high performance and a region with a relatively low performance. For example, a processor having cores with a clock speed of 1.8 GHz and a processor having cores with a clock speed of 1.2 GHz may be mounted in different regions of the first electronic component 500. Referring to FIG. 3, in one example, the first electronic component 500 includes a first unit area 510 and a second unit area 520. The first unit area 510 operates faster than the second unit area 520. Thus, the first unit area 510 uses more power and generates more heat than the second unit area 520.

In one example, the first thermally conductive structure 110 is positioned in an area adjacent to a hot spot. Thus, the heat generated from the hot spot may be rapidly distributed via the first thermally conductive structure 110 to other regions of the circuit board 100 or other devices such as a main board, for example, the additional board 800 in FIG. 1, to which the circuit board 100 is connected.

In one example, at least a part of the first thermally conductive structure 110 is positioned in a region below the first electronic component 500 as shown in FIGS. 1 and 2.

In one example, the circuit board 100 includes a second electronic component 200. Examples of the second electronic component 200 include a capacitor, an inductor, and a resistor.

When the first electronic component 500 is an application processor, a capacitor may be connected with the application processor to reduce power noise. The power noise decreases as a distance between the capacitor and the application processor decreases.

Therefore, in one example, at least a part of the second electronic component 200 is positioned in a region below the first electronic component 500 to reduce power noise as shown in FIGS. 1 and 2.

In one example, most of the first thermally conductive structure 110 is positioned in a region below the first electronic component 500. An area of the upper surface of the first thermally conductive structure 110 may be smaller than an area of the lower surface of the first electronic component 500. The area of the upper surface of the first thermally conductive structure 110 may correspond to the width of the hot spot of the first electronic component 500.

Thus, the heat from the hot spot may move rapidly to the first thermally conductive structure 110. This is also advantageous to reduce warpage and weight of the circuit board 100. Furthermore, efficiency may be improved in the process of arranging the first thermally conductive structure 110 in the circuit board 100.

In one example, most of the second electronic component 200 is positioned in a region below the first electronic component 500 in which the first thermally conductive structure 110 is not positioned. The first thermally conductive structure 110 may be positioned in a region closer to the hot spot compared to the second electronic component 200.

Referring to FIG. 1 to FIG. 4, the first thermally conductive structure 110 is inserted into the cavity C1 in the core part 10, and the second electronic component 200 is inserted into a cavity C2 in the core part 10. The first cavity C1 and the second cavity C2 are formed in the core part 10 so that the first thermally conductive structure 110 can be inserted into the first cavity C1 and the second electronic component 200 can be inserted to the second cavity C2. The first thermally conductive structure 110 and the second electronic component 200 may be arranged to be adjacent to each other region below the first electronic component 500. In particular, the first thermally conductive structure 110 is arranged at the hot spot as shown in FIGS. 1-3. Such an arrangement maximizes reduction of power noise and also distributes heat from the hot spot rapidly. FIG. 5 is a horizontal sectional view schematically illustrating an example of a circuit board where the insulating part 120 does not include the core part 10.

In one example, the first electronic component 500 is mounted on the circuit board 100 by solder S. The first electronic component 500 is connected to the first metal pattern 131, the third metal pattern 133, and a seventh metal pattern 134 by the solder S. The second metal pattern 141, the fourth metal pattern 142, a fifth metal pattern 143, a sixth metal pattern 144 and other metal patterns of the circuit board 100 are connected to the additional board 800 such as a main board by solder S.

In one example, instead of the solder S, a third thermally conductive structure L1 formed of a material and in a shape similar to the material and the shape of the first thermally conductive structure 110 may be formed between the second metal pattern 141 and the additional board 800. For example, the third thermally conductive structure L1 may have a cylindrical shape or a polygonal shape, such as a hexahedron shape. Thus, the second metal pattern 141 and the additional board 800 may be connected together using the third thermally conductive structure L1, which is made in a lump shape and made of a material having higher thermal conductivity than the solder S, to more rapidly transfer heat from the first thermally conductive structure 110 to the additional board 800. In one example, a heat dissipating part L2 is formed in the additional board 800 to distribute or spread heat from the third thermally conductive structure L1. The heat dissipating part L2 is exposed at the upper surface of the additional board 800. It may be also exposed at the lower surface of the additional board 800 to improve heat distribution if needed. A metal pattern formed on the outermost surface of the circuit board 100 to be connected to other electronic components such as the first electronic component 500 or the additional board 800, will be referred to as a pad. Other circuit patterns in addition to the pad may be formed on the outermost surface of the circuit board 100. Furthermore, a solder resist layer (not shown) may be formed on the circuit board 100 to protect the circuit patterns and the insulating part 120. A part of the pad that is to be connected to an external device is not covered by the solder resist layer. A bonding member such as solder or a wire (not shown) is formed between the part of the pad that is not covered by the solder resist layer and a terminal of the external device to provide physical bonding.

As shown in FIG. 1, when the first to the seventh metal patterns 131, 141, 133, 142, 143, 144, and 134 are exposed at the outer surface of the insulating part 120, the first to the seventh metal patterns 131, 141, 133, 142, 143, 144, and 134 are understood as the pad described above. Various surface treatment layers such as a nickel-gold plating layer may be formed on the surface of the exposed metal patterns.

Although not shown in the drawings, an insulating layer may cover the outer surface of the first metal pattern 131, a pad may be further formed on the outer surface of the insulating layer that covers the outer surface of the first metal pattern 131, and a via that passes through the insulating may connect the pad to the first metal pattern 131. If needed, a build-up layer including an insulating layer and a metal layer may be further formed. In this case, the first metal pattern 131 described above will not be a pad and the build-up layer may be connected to the pad formed on the outermost surface of the circuit board through the via.

Thus, the heat generated from the hot spot may be rapidly transferred to the additional board 800 through the path of the first metal pattern 131 to the first via V1 to the first thermally conductive structure 110 to the second via V2 to the second metal pattern 141 to the third thermally conductive structure L1.

When a terminal connected to the first metal pattern 131 is a terminal for transmitting and receiving signals among terminals of the first electronic component 500, the path including the first via V1, the first thermally conductive structure 110, the second via V2, and the second metal pattern 141 function for signal transmission. A contact pad or a terminal of the additional board 800 connected to the second metal pattern 141 may also function for signal transmission.

When a terminal connected to the first metal pattern 131 is not a terminal for transmitting and receiving signals among terminals of the first electronic component 500, the path including the first via V1, the first thermally conductive structure 110, the second via V2, and the second metal pattern 141 may be electrically connected to a ground terminal that is not shown. A contact pad or a terminal of the additional board 800 connected to the second metal pattern 141 may be also electrically connected to the ground terminal. The ground terminal may be mounted on either one or both of the circuit board 100 and the additional board 800.

When a terminal connected to the first metal pattern 131 is a power terminal among terminals of the first electronic component 500, the path including the first via V1, the first thermally conductive structure 110, the second via V2, and the second metal pattern 141 is electrically connected to a power supply circuit that is not shown. A contact pad or a terminal of the additional board 800 connected to the second metal pattern 141 may be also electrically connected to the power supply circuit that is not shown. The power supply circuit may be mounted on either one or both of the circuit board 100 and the additional board 800.

A terminal connected to the first metal pattern 131 may be a dummy terminal. This dummy terminal may only function as a path to dissipate heat from the first electronic component 500.

As described above, the terminals of the first electronic component 500 may be classified into terminals for signal transmission, grounding, power supply, and heat dissipation. This does not mean that a particular terminal can perform only one function. That is, a terminal may also be used for heat dissipation while transmitting signals or power. This means that when the terminals formed at the hot spot of the first electronic component 500 perform heat dissipation, the heat from the hot spot may be more rapidly dissipated. When the terminals that perform heat dissipation are in contact with a bonding member (not shown) and the bonding member is in contact with the first metal pattern 141, heat transfer between the hot spot and first thermally conductive structure 110 may be smooth.

In one example, at least one terminal of the first electronic component 500 that is electrically connected to the first thermally conductive structure 110 is a dummy terminal that only functions for heat dissipation. When another that functions only for signal transmission among the terminals of the first electronic component 500 is also connected to the first thermally conductive structure 110, a signal loss problem will occur. Thus, the that functions only for signal transmission among the terminals of the first electronic component 500 may not be electrically connected to the first thermally conductive structure 110. That is, a via or a circuit pattern connected to the pad connected to the terminal only for signal transmission among the terminals of the first electronic component 500 may not be electrically connected to the first thermally conductive structure 110.

Referring to FIG. 1 to FIG. 4 and FIG. 6 to FIG. 9, the circuit board 100 includes the core part 10. The core part 10 functions to alleviate problems caused by warpage by increasing the rigidity of the circuit board 100. The core part 10 includes a material having high thermal conductivity to rapidly distribute heat generated from a localized region such as the hot spot to other parts of the circuit board 100 so that problems caused by overheating may be alleviated.

A first upper insulating layer 121 is formed on the upper surface of the core part 10 and a first lower insulating layer 121' is formed on the lower surface of the core part 10. A second upper insulating layer 122 and a second lower insulating layer 122 may be also formed if needed as shown in FIG. 2.

In one example, the core part 10 includes a second thermally conductive structure. For example, the core part 10 includes a first core layer 11 composed of graphite or graphene. Graphite has a very high thermal conductivity in an XY plane direction to distribute heat efficiently and rapidly.

In one example, the second thermally conductive structure is directly in contact with the side surface of the first thermally conductive structure 110. For example, the side surface of the second thermally conductive structure is exposed at the inner surface of the first cavity C1 formed in the core part 10, and the first thermally conductive structure 110 is in contact with the inner surface of the first cavity C1. In another example, a material with a high thermal conductivity is provided in a region between the second thermally conductive structure and the first thermally conductive structure 110. In this example, the material with a high thermal conductivity is a thermal interface material (TIM). The TIM may be a thermally conductive insulating material. The TIM may be a polymer-metal composite material, a ceramic composite material, or a carbon-based composite material. Examples of the TIM include a mixed material of epoxy and a carbon fiber filler having a thermal conductivity of about 660 W/mK), silicon nitride ($Si_3N_4$) having a thermal conductivity of about 200-320 W/mK), and epoxy and boron nitride (BN) having a thermal conductivity of about 19 W/mK). Thus, the heat transferred to the first thermally conductive structure 110 may be rapidly distributed in a vertical direction and a horizontal direction through the second thermally conductive structure.

When the first thermally conductive structure 110 and the second thermally conductive structure are directly in contact each other or are connected to each other through the TIM, heat can be dispersed more rapidly compared to when the heat is transferred only in a downward direction after it is transferred from the first electronic component 500 to the first thermally conductive structure 110. In addition, as heat is evenly distributed throughout the circuit board 100, a temperature deviation of each component and element mounted on the circuit board 100 may be reduced, resulting in an improvement of a reliability of the circuit board 100 compared with the case in which temperature increases excessively at a certain region such as the hot spot on the circuit board 100. Furthermore, as heat is rapidly distributed throughout the circuit board 100, the circuit board 100 itself may function as a heat dissipating film to increase a radiant heat area.

In one example, a first circuit pattern P1 and a second circuit pattern P2 are formed on opposite surfaces of the core part 10. The first circuit pattern P1 and the second circuit pattern P2 are electrically connected to each other by a through via TV that passes through the core part 10. The first circuit pattern P1 is connected to the third metal pattern 133 through the fourth via V4, and the second circuit pattern P2 is connected to the fourth metal pattern 142 through the fifth via V5. The third metal pattern 133 is connected to the first electronic component 500 through the solder S, and the fourth metal pattern 142 may be connected to a contact pad 810 of the additional board 800 through the solder S. Thus, a path is provided for transmitting and receiving electrical signals between the first electronic component 500 and the additional board 800.

A second core layer 12 is formed on one surface of the first core layer 11 and a third core layer 13 is formed on the other surface of the first core layer 11. In one example, either one or both of the second core layer 12 and the third core layer 13 is composed of an insulating material such as a prepreg (PPG). In another example, the second core layer 12 and the third core layer 13 are composed of a metal such as copper or invar. In still another example, the first core layer 11 is composed of invar and the second core layer 12 and third core layer 13 are composed of copper. When either one or both one of the second core layer 12 and the third core layer 13 is composed of a conductive material, signals may be transmitted over an unintended path due to the first circuit pattern P1 or the second circuit pattern P2 formed on the surface of the core part 10. Thus, any part or unit may be formed on the surface of the core part 10 to ensure the dielectric property.

In one example, the second electronic component 200 is inserted into the second cavity C2 of the core part 10. The second electronic component 200 is connected to the seventh metal pattern 134 through a sixth via V6, and is connected to the sixth metal pattern 144 through a seventh via V7. The second electronic component 200 may be a passive element such as an inductor, a capacitor, or a resistor. The second electronic component 200 may be an active element such as an IC (integrated circuit) if needed. When the second electronic component 200 is a capacitor, a terminal of the first electronic component 500 connected to the seventh metal pattern 134 may be a power terminal. That is, the second electronic component 200 may be mounted as a decoupling capacitor to reduce power noise of the first electronic component 500.

The shorter the distance between the second electronic component 200 and the first electronic component 500 is, the more power noise decreases. Thus, at least a part of the second electronic component 200 may be arranged below the first electronic component 500 in the circuit board 100.

Although not shown in FIGS. 1 and 2, a recess part may be formed in the core part 10 instead of the cavity C1 or C2, and the first thermally conductive structure 110 or the second electronic component 200 may be inserted into the recess part.

Referring to FIG. 1, in one example, a thickness of the first thermally conductive structure 110 is thicker than a distance from the lower surface of the second circuit pattern P2 to the upper surface of the first circuit pattern P1. The upper surface of the first thermally conductive structure 110 is positioned closer to the upper surface of the circuit board 100 than the upper surface of the first circuit pattern P1. Thus, a heat capacity of the first thermally conductive structure 110 is increased to absorb more heat. Furthermore, a distance between the first thermally conductive structure 110 and the hot spot is reduced to shorten the heat transfer time from the hot spot to the first thermally conductive structure 110.

In one example, the lower surface of the first thermally conductive structure 110 is positioned on the same horizontal plane as the lower surface of the second circuit pattern P2. The thickness of the first thermally conductive structure 110 is thicker than a distance from the lower surface of the second circuit pattern P2 to the upper surface of the first circuit pattern P1 to increase the heat capacity of the first thermally conductive structure and shorten the distance to the hot spot.

Although not shown in the drawings, in another example, the upper surface of the first thermally conductive structure 110 is positioned on the same horizontal plane as the upper surface of the first circuit pattern P1. The thickness of the first thermally conductive structure 110 is thicker than a distance from the lower surface of the second circuit pattern P2 to the upper surface of the first circuit pattern P1 to increase the heat capacity of the first thermally conductive structure.

So far theoretical or ideal geometrical relations have been described. However, when the structure described above is implemented in actual products, various variations may occur during the manufacturing process. For example, both sides of the core part 10 may not be completely flat, or a thickness may vary among circuit patterns formed on the core part 10. Therefore, it will be apparent to one of ordinary skill in the art that realistic process variations may be taken into account when interpreting the scope of this disclosure. It will also be apparent to one of ordinary skill in the art that a certain extent of warpage may occur during the process of manufacturing circuit boards due to demands for electronic devices with smaller sizes and thinner wiring patterns. Since this warpage may cause problems such as shorts or cracks in wires, efforts are made to minimize the warpage. However, it may be practically difficult to completely eliminate the warpage so that a circuit board may be treated as non-defective when the warpage is within a predetermined allowable range. Accordingly, the circuit board may also allow a certain extent of the warpage that may be determined depending of the thickness and/or position of the first thermally conductive structure 110.

Referring to FIG. 2, the second upper insulating layer 122 is formed on the first upper insulating layer 121, and the second lower insulating layer 122' is formed on the first lower insulating layer 121'. The height of the first via V1 and the second via V2 formed between the external surface of the circuit board 100 and the first thermally conductive structure 110 is shorter than the height of the vias V4', V5', V6', V7', and V9' formed between the external surface of the circuit board 100 and inner layer patterns P1' and P2' and other inner layer patterns to increase both the heat capacity and the heat distribution of the first thermally conductive structure 110. FIG. 2 also shows vias V9 and V11 and a through via TV that connects the vias V9 and V11 to each other. The upper surface of the first thermally conductive structure 110 may be covered with the first upper insulating layer 121 even though this is not shown in FIG. 2. In this case, one surface of a via that passes through the is in contact with the first thermally conductive structure 110, and another surface of the via is in contact with a metal pattern formed on the first upper insulating layer 121. One surface of the via V1 that passes through the second upper insulating layer 122 is in contact with the metal pattern formed on the first upper insulating layer 121, and another surface of the via V1 is connected to the first electronic component through the first metal pattern 131 formed on the second upper insulating layer 122 and the solder S. That is, the number of build-up layers to be formed on the first thermally conductive structure 110 may be determined as needed. However, at least in terms of the heat capacity, the greater the thickness of the first thermally conductive structure 110, the better.

Referring to FIG. 6, an insulating film 14 is formed on the surface of the core part 10. In one example, a first core layer 11 to a third core layer 13 have not only thermal conductivity but also electrical conductivity. When the first circuit pattern P1 and the second circuit pattern P2 are formed on the surface of the core part 10, the insulating film 14 is needed to prevent electricity from flowing to other circuit patters formed on the surface of the core part 10 through an undesired path. The insulating film 14 may be formed by vapor deposition of Parylene (poly(p-xylylene) polymer) or another suitable insulating material on the surface of the core part 10. The insulating film 14 may be formed inside a through via hole by applying an insulating material on the surface of the core part 10 after forming the through via hole in the core part 10. Thus, the dielectric property may be provided between the core part 10 and the through via TV, the first circuit pattern P1, and the second circuit pattern P2.

In one example, core via holes are formed to expose parts of the first core layer 11 by passing through the second core layer 12 and the third core layer 13. An eighth via V8 and a ninth via V8', which are formed by depositing a conductive material in the core via holes directly contact the first core layer 11. When the insulating film 14 is formed on the core part 10 in which the core via hole is formed, the insulating film 14 is formed on the exposed parts of the first core layer 11 so the first core layer 11 is separated from the eighth via V8 and the ninth via V8' by the insulating film 14. Thus, when heat is transferred to the eighth via V8 and the ninth via V8' that are directly (or indirectly when the insulating film 14 is formed) in contact with the first core layer 11, the heat is rapidly distributed in the horizontal direction in the circuit board 100 along the first core layer 11.

In one example, when the second thermally conductive structure is formed of graphite or graphene, adhesion between layers may decrease. Thus, the second thermally conductive structure may be broken during the process of manufacturing the circuit board 100 or the reliability may decrease due to the lowered adhesion between layers after the circuit board 100 is manufactured.

As shown in FIG. 6, a through hole 11c is formed in the first core layer 11 so that the second core layer 12 and the third core layer 13 may be integrated with each other through the through hole 11c to firmly support the first core layer 11. Thus, even though the first core layer 11 is formed of graphite or graphene, the adhesion between layers is increased.

Referring to FIG. 7, a primer layer 111 is formed on the outer surface of the first core layer 11 to improve the adhesion between layers. The primer layer 111 improves not only the adhesion between the graphite or graphene but also the adhesion between the first core layer 11 and the second core layer 12 and between the first core layer 11 and the third core layer 13.

In another example, referring to FIG. 8, a first core layer 11 is formed by laminating unit layers 11-1, 11-2, 11-3, and 11-4 on which the primer layer 111 is formed on the surface of the graphite in a vertical direction. The unit layers 11-1, 11-2, 11-3, and 11-4 may also be referred to as unit structures 11-1, 11-2, 11-3, and 11-4. This structure minimizes a reduction of horizontal heat distribution in the first core layer 11 and alleviates delamination in a vertical direction of the first core layer 11.

In another example, referring to FIG. 9, the first core layer 11 is formed by laminating unit layers 11-1', 11-2', 11-3', 11-4' on which the primer layer 111 is formed on the surface of the graphite in a horizontal direction. An XY plane of graphite is arranged in the vertical direction. This may somewhat reduce heat distribution in the horizontal direction, but increase heat distribution in the vertical direction using the first core layer 11.

The first thermally conductive structure 110 included in the circuit board 100 may further include an adhesion improving part to improve adhesion with the insulating part 120.

When the surface of the first thermally conductive structure 110 is directly in contact with the insulating part 120, a gap may occur between the first thermally conductive structure 110 and the insulating part 120 during a reflow process or a solder pot process due to a phenomenon called delamination. A primer layer 111 may be further formed on the surface of the first thermally conductive structure 110 to improve the adhesion with the insulating part 120. In one example, the primer layer 111 may be made of a primer including isopropyl alcohol and acrylic silane.

The primer layer 111 may be composed of 3-(trimethoxysilyl)propyl methacrylate (MPS) and may further include a silane-based additive.

Figure 10A:
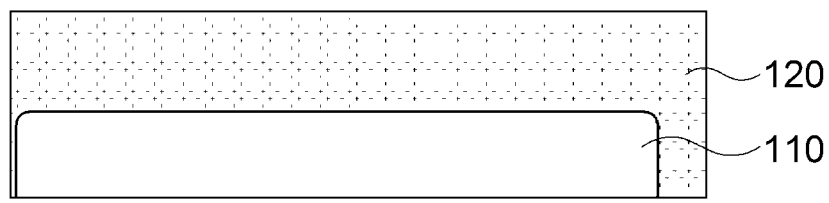
FIG. 10A is a schematic view illustrating an example of a reflow test result performed when a primer layer is formed on the surface of the thermally conductive structure.
Figure 10B:
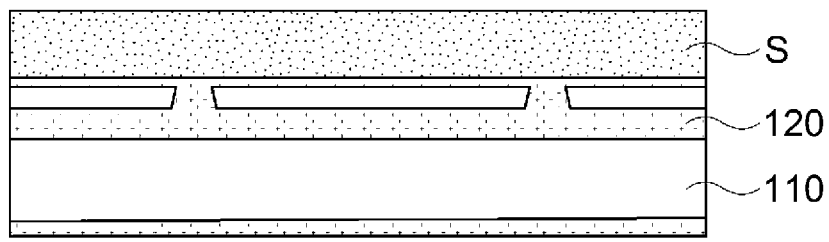
FIG. 10B is a schematic view illustrating an example of a solder pot test result performed when a primer layer is formed on the surface of the thermally conductive structure.
Figure 11A:
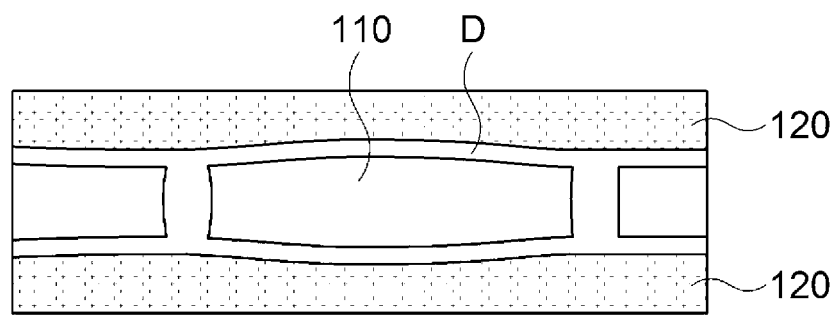
FIG. 11A is a schematic view illustrating an example of a reflow test result performed when an insulating part directly contacts the thermally conductive structure.
Figure 11A:
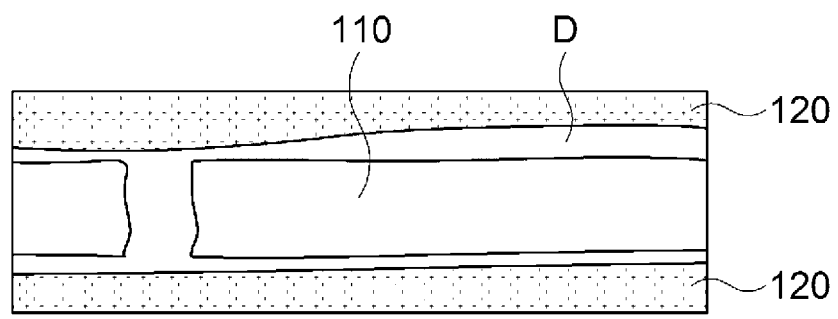
Figure 11A:
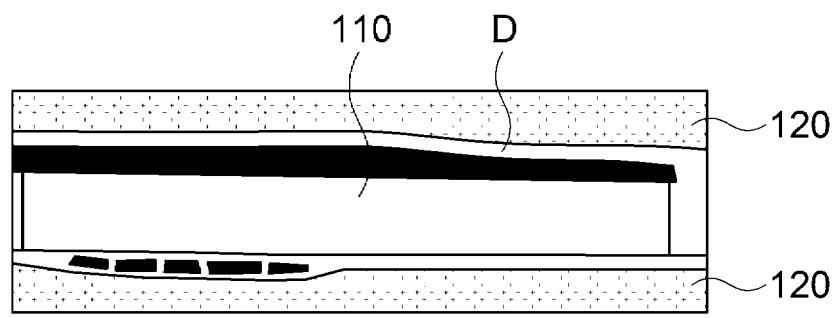
Figure 11B:
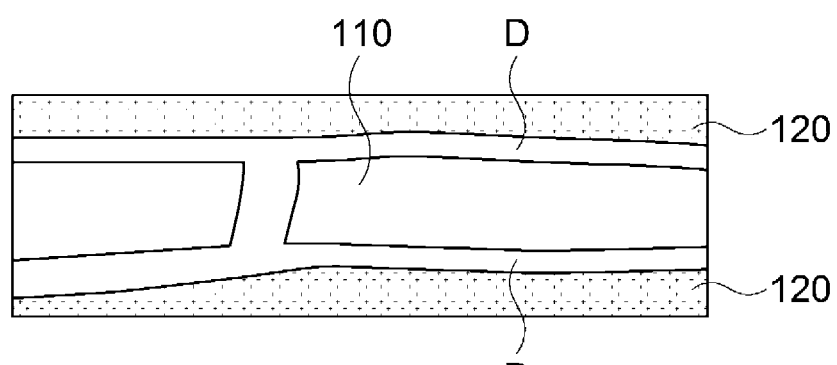
FIG. 11B is a schematic view illustrating an example of a solder pot test result performed when an insulating part directly contacts the thermally conductive structure.
Figure 11B:
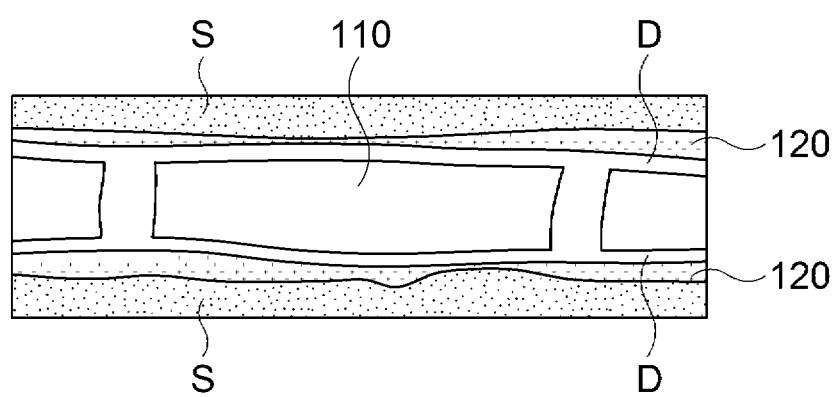

FIG. 10A is a schematic view illustrating an example of a reflow test result performed when a primer layer is formed on the surface of the thermally conductive structure, FIG. 10B is a schematic view illustrating an example of a solder pot test result performed when a primer layer is formed on the surface of the thermally conductive structure, FIG. 11A is a schematic view illustrating an example of a reflow test result performed when the insulating part 120 directly contacts the thermally conductive structure, and FIG. 11B is a schematic view illustrating an example of a solder pot test result performed when the insulating part 120 directly contacts the thermally conductive structure.

Referring to FIG. 10A to FIG. 11B, when there is no primer layer 111, a gap D occurs between the thermally conductive structure and the insulating part 120 during the reflow process or the solder pot process. However, when the primer layer 111 is formed on the surface of the thermally conductive structure, the adhesion between the thermally conductive structure and the insulating part 120 is improved. The thermally conductive structure may be either one or both of the first thermally conductive structure 110 and the second thermally conductive structure.

In a conventional method, the adhesion between the first thermally conductive structure 110 and the insulating part 120 may be improved by performing a surface treatment such as blackening and roughening on the surface of the first thermally conductive structure 110.

However, when the surface of the first thermally conductive structure 110 is surface treated, problems may occur during the manufacturing process. For example, the color of the first thermally conductive structure 110 may vary due to the surface treatment. In this case, an automated device that installs the first thermally conductive structure 110 on the insulating part 120 may experience frequent errors in the process of recognizing the first thermally conductive structure 110.

Accordingly, the circuit board 100 including the primer layer 111 may reduce the delamination between the first thermally conductive structure 110 and the insulating part 120.

Referring to FIG. 1 again, when the primer layer 111 is formed on the surface of the first thermally conductive structure 110, the first via V1 or the second via V2 is still in contact with the first thermally conductive structure 110 through the primer layer 111. Thus, it may minimize reduction in heat distribution due to the primer layer 111. The thickness of the primer layer 111 is exaggerated in the drawings to help understanding the primer layer 111. The primer layer 111 is formed in a thin film having a thickness that is much thinner than shown in the drawings. Since the thickness of the primer layer 111 is exaggerated in the drawing, the lower surface of the primer layer 111 is shown to be positioned in the same plane as the lower surface of the second circuit pattern P2, and so the lower surface of the first thermally conductive structure 110 is shown to be positioned slightly higher than the lower surface of the second circuit pattern P2 due to the exaggerated thickness of the primer layer 111. However, since the thickness of the primer layer 111 is much thinner than the thicknesses of the second circuit pattern P2 and the first thermally conductive structure 110 the thickness of the primer layer 111 may be ignored in understanding the positional relationship of the first thermally conductive structure 110 and the second circuit pattern P2.

Figure 12:
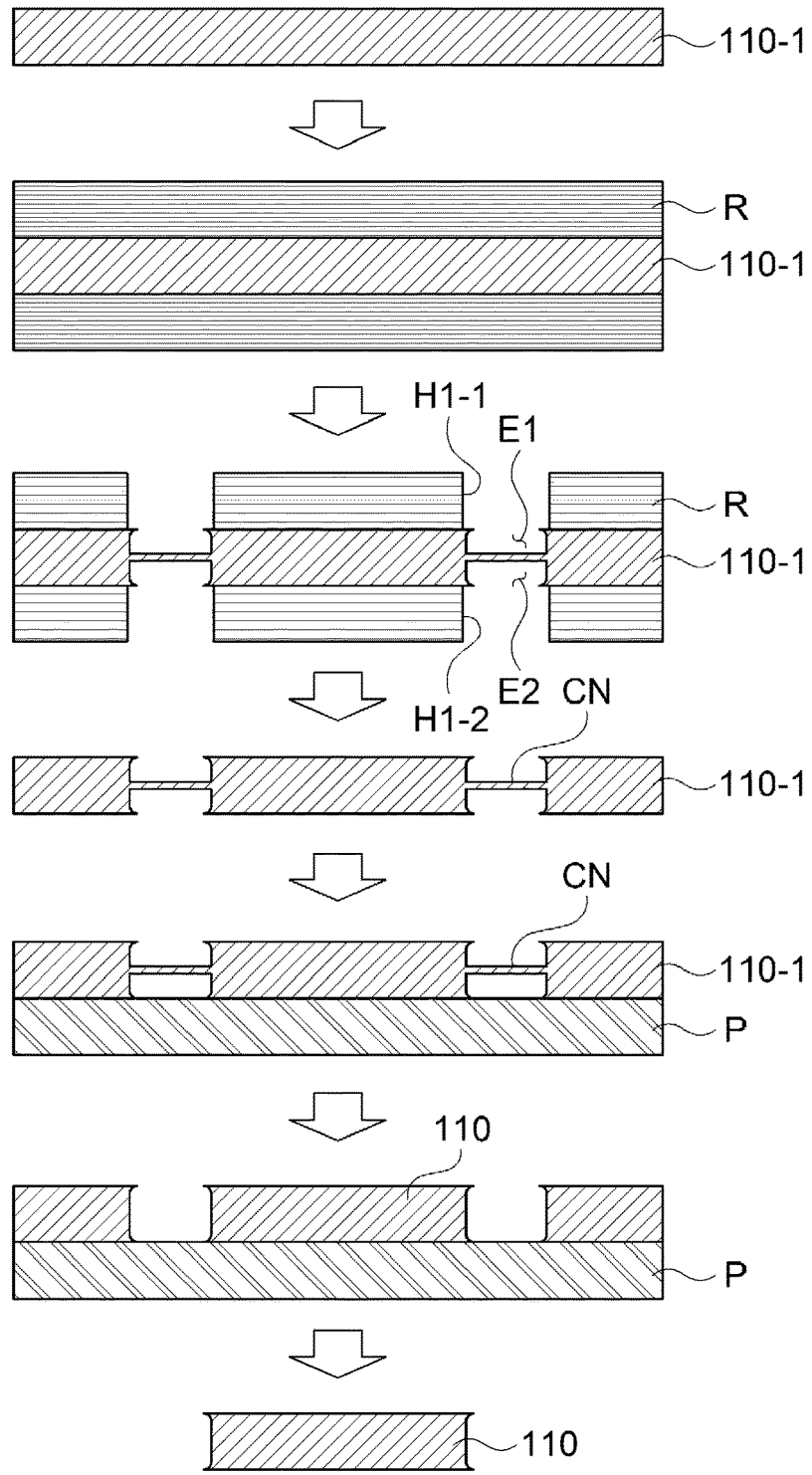
FIG. 12 illustrates an example of a process of manufacturing a thermally conductive structure.

FIG. 12 illustrates a process of manufacturing a thermally conductive structure.

Referring to FIG. 12, after a metal plate 110-1 formed of a metallic material such as Cu is provided, a resist layer R is formed on the metal plate 110-1. The resist layer R is patterned to correspond to the shape of the first thermally conductive structure 110 by forming opening parts H1-1, H1-2, and then an etching process is performed to form etching holes E1, E2. When a plurality of the first thermally conductive structures 110 are to be formed from one metal plate 110-1, the etching process may be performed until a connecting part CN remains for the convenience of the subsequent processes. Then, the resist layer R is removed, the metal plate 110-1 is disposed on another plate P, and the connecting part CN is removed to provide the first thermally conductive structure 110. As shown in FIG. 12, residue from the etching may remains on the side surface of the first thermally conductive structure 110. That is, the side surface of the first thermally conductive structure 110 is concave toward the inside of the first thermally conductive structure 110.

Figure 13:
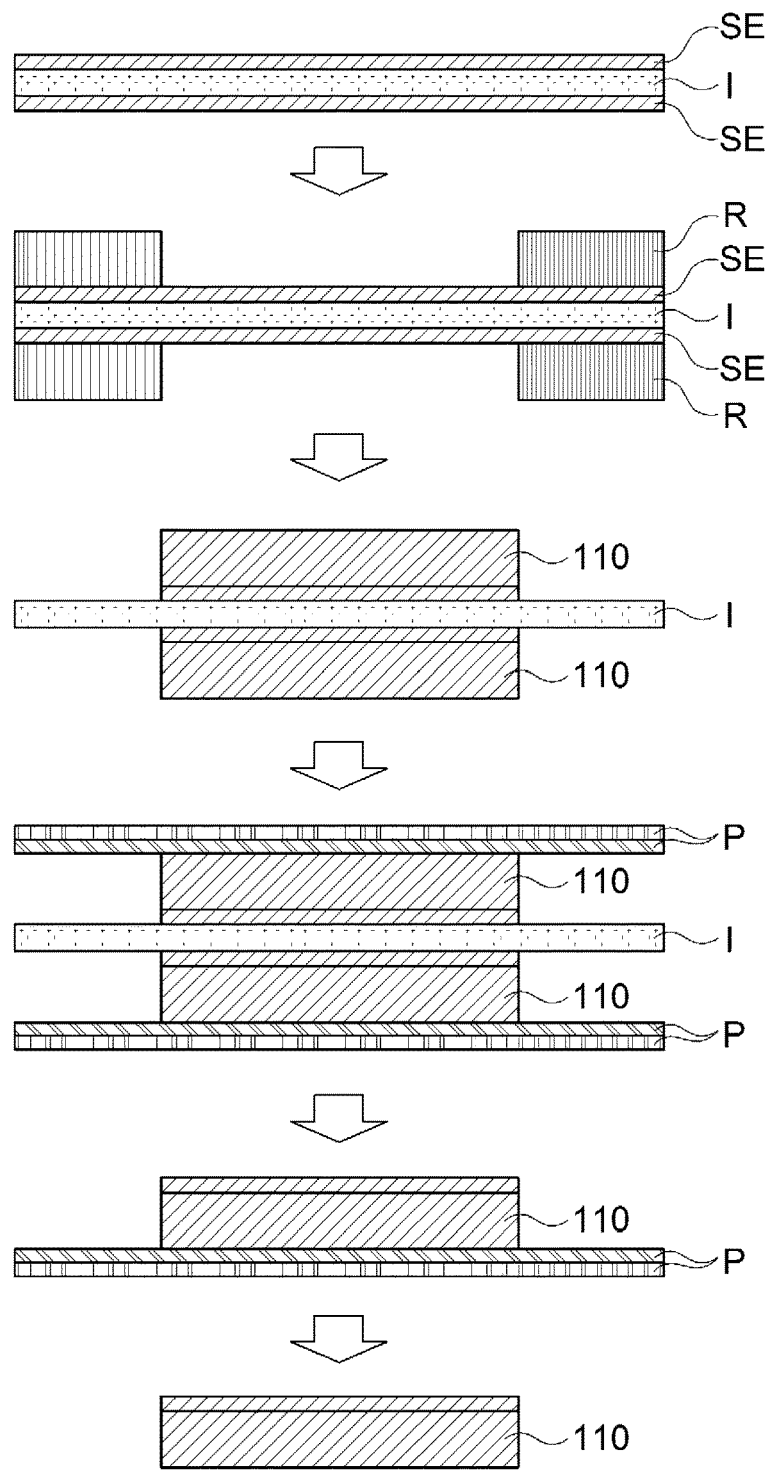
FIG. 13 illustrates another example of a process of manufacturing a thermally conductive structure.

FIG. 13 illustrates another example of a process of manufacturing a thermally conductive structure.

Referring to FIG. 13, a resist layer R is formed on a seed layer SE, and the resist layer R is patterned to open a region corresponding to the shape of the first thermally conductive structure 110. The first thermally conductive structure 110 is formed by coating one or more layers on the seed layer SE and removing the resist layer R and the underlying seed layer. Multi-coating of several to hundreds of layers may be performed to increase a thickness of the first thermally conductive structure 110. When the multi-coating is performed, a layered structure is provided. I is a plate composed of a metal or non-metallic material serving as a supporting part to support the seed layer SE.

In the method of FIG. 12, a uniformity of the thickness of the first thermally conductive structure 110 is increased, while the side shape of the first thermally conductive structure 110 is relatively irregular. As a result, a variation of a width may increase. Therefore, if thickness control of the first thermally conductive structure 110 is important, the first thermally conductive structure 110 may be manufactured using the method of FIG. 12.

In the method of FIG. 13, a uniformity of the width of the first thermally conductive structure 110 is improved, while a thickness variation of the first thermally conductive structure 110 may be increased due to variations in the coating process. Therefore, if width control of the first thermally conductive structure 110 is important, the first thermally conductive structure 110 may be manufactured using the method of FIG. 13.

Figure 14:
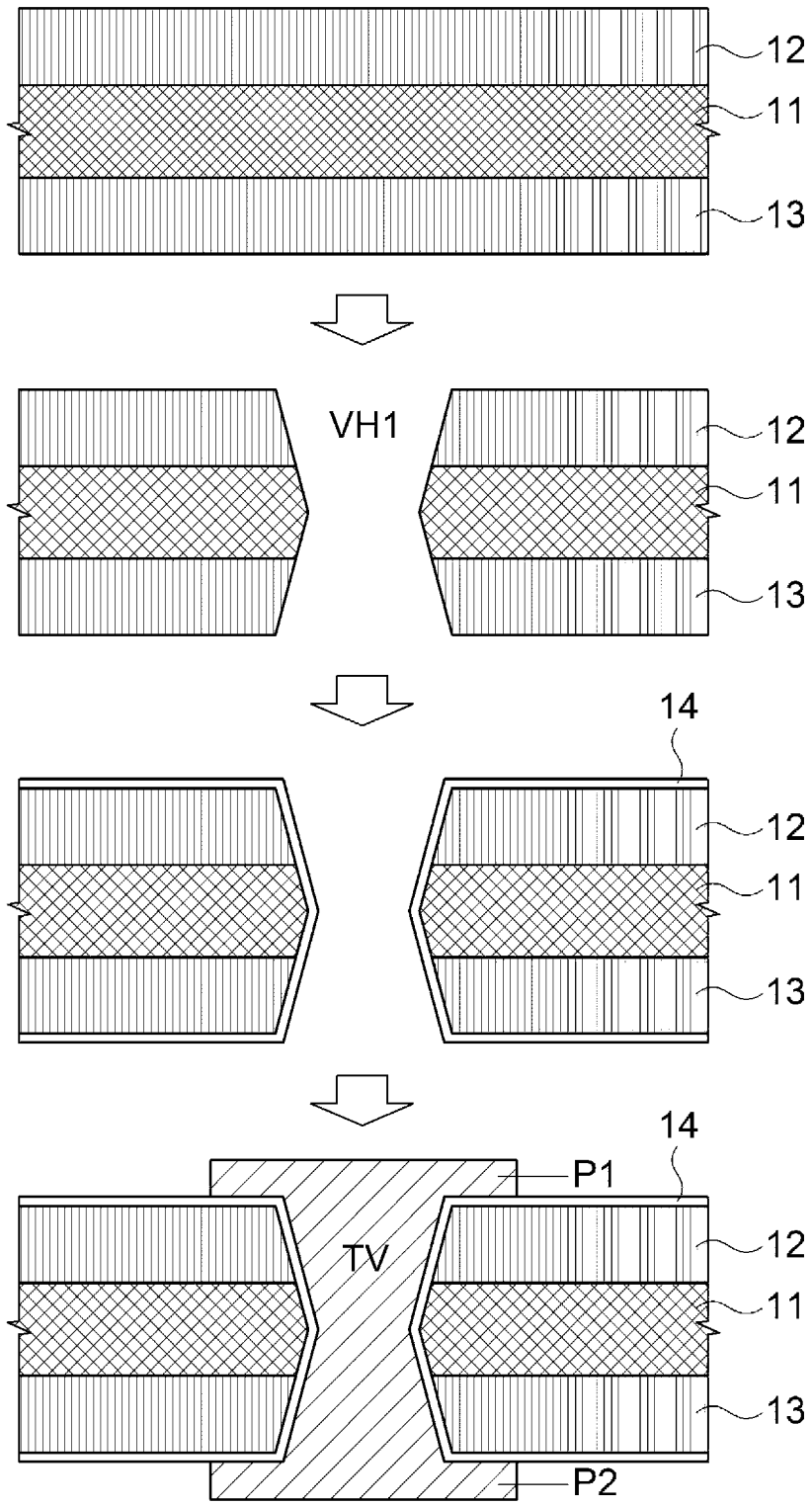
FIG. 14 illustrates an example of a process of processing a core part.

FIG. 14 illustrates a process of processing a core part 10.

Referring to FIG. 14, a via hole VH1 is formed in a core part including a first core layer 11, a second core layer 12, and a third core layer 13, and an insulating film 14 is formed on the surface of the core part and the inner surface of the via hole VH1. A first circuit pattern P1, a through via TV, and a second circuit pattern P2 are then formed on the insulating film 14 to ensure the dielectric property between the first circuit pattern P1 and the core part 10, and between the second circuit pattern P2 and the core part 10.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board comprising:
   an insulating part comprising insulating layers;
   metal layers disposed on the insulating layers;
   vias each passing through at least one insulating layer among the insulating layers and connecting together at least two metal layers among the metal layers;
   a first thermally conductive structure comprising a thermally conductive material, at least a part of the first thermally conductive structure being inserted into the insulating part, wherein the first thermally conductive structure comprises a multi-coated layered structure including an adhesion promoting part disposed between each plural layer of the multi-coated layered structure;
   a first via having one surface contacting the first thermally conductive structure;
   a first metal pattern contacting another surface of the first via;
   a first bonding member connected to the first metal pattern; and
   pads to which a first electronic component is connected on an outermost surface of a metal layer disposed on an outermost surface of the insulating part among the metal layers, the pads comprising at least one pad in a first region of the circuit board having a first temperature while the first electronic component is operating, and at least one pad in a second region of the circuit board having a second temperature higher than the first temperature while the first electronic component is operating.

2. The circuit board of claim 1, wherein the first bonding member is also connected to the first electronic component.

3. The circuit board of claim 2, wherein at least a part of the first thermally conductive structure is positioned below the first electronic component.

4. The circuit board of claim 3, further comprising a second electronic component mounted in the insulating part; wherein at least a part of the second electronic component is positioned below the first electronic component.

5. The circuit board of claim 2, wherein a distance from the second region to the first bonding member is less than a distance from the first region to the first bonding member.

6. The circuit board of claim 1, wherein the pads comprise:
a first pad through which heat passes while the first electronic component is operating; and
a second pad through which a signal passes while the first electronic component is operating; and
the first bonding member is connected to the first pad.

7. The circuit board of claim 6, wherein the metal layer disposed on the outermost surface of the insulating part comprises a metal pattern connected to the second pad but not connected to the first thermally conductive structure.

8. The circuit board of claim 1, further comprising an adhesion promoting part disposed on an outer surface of the first thermally conductive structure.

9. The circuit board of claim 1, wherein at least one side surface of the first thermally conductive structure has a concave shape.

10. The circuit board of claim 1, further comprising at least one via and at least one metal pattern between the first metal pattern and the first bonding member so that the first bonding member is connected to the first metal pattern through the at least one via and the at least one metal pattern.

11. The circuit board of claim 1, wherein an upper surface and a lower surface of the first thermally conductive structure each have a hexahedron shape, and more than one via contacts a same one of the upper surface and the lower surface of the first thermally conductive structure.

12. The circuit board of claim 1, further comprising:
a second via having one surface contacting a lower surface of the first thermally conductive structure;
a second metal pattern contacting another surface of the second via; and
a second bonding member connected to the second metal pattern;
wherein an upper surface and the lower surface of the first thermally conductive structure have a hexahedron shape, and one surface of the first via contacts the upper surface of the first thermally conductive structure.

13. The circuit board of claim 12, wherein the second bonding member is also connected to an additional board.

14. The circuit board of claim 13, wherein a distance from the second region to the first bonding member is less than a distance from the first region to the first bonding member.

15. The circuit board of claim 13, wherein the additional board comprises a heat dissipating part comprising a thermally conductive material and extending through the additional board so that an upper surface and a lower surface of the heat dissipating part are exposed at an upper surface and a lower surface of the additional board; and
the second bonding member comprises a thermally conductive material, has a cylindrical shape or a polygonal shape, and contacts the heat dissipating part.

16. A circuit board comprising:
an insulating part; and
a first thermally conductive structure comprising a thermally conductive material, at least a part of the first thermally conductive structure being inserted into the insulating part, wherein the first thermally conductive structure comprises a multi-coated layered structure including an adhesion promoting part disposed between each plural layer of the multi-coated layered structure, and wherein the adhesion promoting part is disposed on an outer surface of, and surrounds, the thermally conductive structure.

17. The circuit board of claim 16, wherein the adhesion promoting part comprises silane.

18. The circuit board of claim 17, wherein the silane is acrylic silane.

19. The circuit board of claim 16, wherein the insulating part comprises:
a core part comprising a second thermally conductive structure comprising a thermally conductive material; and
at least one insulating layer disposed on a surface of the core part.

20. The circuit board of claim 1, wherein the adhesion promoting part comprises 3-(trimethoxysilyl)propyl methacrylate.

21. The circuit board of claim 20, wherein the adhesion promoting part comprises acrylic silane.

22. The circuit board of claim 16, wherein the adhesion promoting part is further disposed on an outer surface of the multi-coated layered structure.

23. The circuit board of claim 16, wherein the adhesion promoting part comprises a primer layer.

* * * * *